(12) United States Patent
Hong et al.

(10) Patent No.: US 7,168,479 B2
(45) Date of Patent: Jan. 30, 2007

(54) HEAT TRANSFER APPARATUS

(75) Inventors: Young-ki Hong, Anyang (KR);
Kyung-il Cho, Seoul (KR);
Byeoung-ju Ha, Yongin (KR);
Jong-beom Kim, Yongin (KR);
Hye-jung Cho, Anyang (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 291 days.

(21) Appl. No.: 10/732,282

(22) Filed: Dec. 11, 2003

(65) Prior Publication Data

US 2005/0051306 A1 Mar. 10, 2005

(30) Foreign Application Priority Data

Dec. 11, 2002 (KR) ............... 10-2002-0078720

(51) Int. Cl.
*F28D 15/02* (2006.01)
*H05K 7/20* (2006.01)

(52) U.S. Cl. ............... 165/104.21; 165/104.26; 165/104.33

(58) Field of Classification Search ........... 165/104.21, 165/104.26, 104.33, 80.4; 361/699, 700; 257/714, 715
See application file for complete search history.

(56) References Cited

U.S. PATENT DOCUMENTS

| | | | | |
|---|---|---|---|---|
| 6,293,332 B2 * | 9/2001 | Li | ............... | 165/104.26 |
| 6,341,645 B1 * | 1/2002 | Tanaka et al. | ............... | 165/104.33 |
| 6,601,643 B2 * | 8/2003 | Cho et al. | ............... | 165/104.26 |
| 6,688,377 B2 * | 2/2004 | Wang | ............... | 165/104.26 |
| 6,698,502 B1 * | 3/2004 | Lee | ............... | 165/104.26 |
| 6,698,503 B2 * | 3/2004 | Son et al. | ............... | 165/104.26 |
| 6,976,527 B2 * | 12/2005 | Kirshberg et al. | ............... | 165/104.33 |
| 2002/0170705 A1 * | 11/2002 | Cho et al. | ............... | 165/104.26 |
| 2003/0051859 A1 * | 3/2003 | Chesser et al. | ............... | 165/46 |

* cited by examiner

*Primary Examiner*—Tho Duong
(74) *Attorney, Agent, or Firm*—Sughrue Mion, PLLC

(57) ABSTRACT

Provided is a highly efficient, slim heat transfer apparatus, including a main body connected to an end of a condensing zone through a liquid coolant reservoir. An extension of the main body is connected to the other end of the condensing zone. The main body has a coolant reservoir that stores liquid coolant supplied from the condensing zone, a vaporization zone in which the liquid coolant supplied from the coolant reservoir is vaporized, and a channel region connecting the coolant reservoir to the vaporization zone. The channel region acts as a channel for supplying the liquid coolant from the coolant reservoir to the vaporization zone.

25 Claims, 12 Drawing Sheets

HEAT TRANSFER APPARATUS

BACKGROUND OF THE INVENTION

This application claims the priority of Korean Patent Application No. 02-78270, filed on Dec. 11, 2002 in the Korean Intellectual Property Office, the disclosure of which is incorporated herein in its entirety by reference.

1. FIELD OF INVENTION

The present invention relates to a heat transfer apparatus, and more particularly, to a slim heat transfer apparatus for cooling a heat generating device such as a CPU or the like, by natural circulation of a coolant due to capillary action.

2. DESCRIPTION OF THE RELATED ART

As clock speed is increased and the area of a chip or a package is decreased, heat density of components such as CPUs of electronic devices is increased. In other words, smaller, lighter, and thinner electronic devices are high performance, but cause greater heat generation per unit area. If heat generated by an electronic component is not efficiently dissipated away from the component over a period of time, the performance of the component may diminish. In addition, the heat generating electronic component could heat adjacent components and diminish their performance as well. Thus, various heat transfer devices designed to efficiently dissipate heat away from heat generating electronic components have been proposed, and some of them are widely used.

FIGS. 1 and 2 show conventional heat transfer apparatuses. FIG. 1 is a cross-sectional view of a straight heat pipe, and FIG. 2 is a plan view of a loop-type heat pipe.

Referring to FIG. 1, a straight heat pipe 6 is a hollow cylinder. A hollow area 7 of the heat pipe 6 is a passage for vapor 10 created by absorbing heat 8 generated from a heat generating element (not shown) in a first zone R1 of the heat pipe 6. Hereinafter, the hollow area 7 is referred to as a vapor passage 7. An area 9 inside the cylinder wall of the heat pipe 6 is a passage for a liquid coolant. The area 9 may be made of a wick material for causing capillary action. Hereinafter, the area 9 is referred to as a wick cylinder 9.

Vapor 10 created in first zone R1 of the heat pipe 6 in contact with a heat generating element is condensed into liquid coolant in a third zone R3 of the heat pipe 6. In this process, latent heat of the vapor 10 is dissipated to outside of the heat pipe 6 and a liquid coolant is formed in the third zone R3. Reference numeral 16 indicates heat being dissipated from the heat pipe 6 via the third zone R3 of the wick cylinder 9. The liquid coolant formed in the third zone R3 travels to the first zone R1 through the wick cylinder 9 by capillary action. The liquid coolant arriving back in zone R1 absorbs heat 8 from the heat generating element in contact with zone R1, is vaporized, and travels to zone R3 through the vapor passage 7. Reference character R2 indicates a second zone through which the liquid coolant is moved from the third zone R3 to the first zone R1 and reference numeral 14 indicates the flow of liquid coolant from the third zone R3 to zone R1 via second zone R2.

Referring now to FIG. 2, a conventional loop-type heat pipe 20 comprises a vaporization part 22 in contact with a heat generating element (not shown), and conduits 24 and 26 extending from both ends of the vaporization part 22 and forming a closed loop. The conduits 24 and 26 consist of a vapor conduit 24 through which vapor generated at the vaporization part 22 by heat 28 transferred from the heat generating element passes, and a liquid conduit 26 through which liquid coolant formed by condensation of the vapor is supplied back to the vaporization part 22. The liquid conduit 26 begins where condensation of the vapor begins while moving through the vapor conduit 24. The vapor conduit 24 is connected to one end of the vaporization part 22 while the liquid conduit 26 is connected to the other end of the vaporization part 22. Inside of the vaporization part 22, wick material is formed so as to enable capillary action. As soon as the liquid coolant arrives at the vaporization part 22 through the liquid conduit 26, it spreads out across the entire vaporization part 22 by capillary action. In FIG. 2, reference numeral 25 indicates the flow of vapor, reference numeral 27 indicates the flow of liquid coolant, and reference numeral 30 indicates heat dissipated to the outside when vapor condenses.

Nowadays, there is a trend in the development of electronic devices toward slim and compact structures. However, since the conventional straight heat pipe 6 depicted in FIG. 1, and the vaporization part 22 of the conventional loop-type heat pipe 20 depicted in FIG. 2, are cylindrical, it is difficult to make either of these conventional heat pipes sufficiently slim and compact for modern applications.

SUMMARY OF THE INVENTION

The present invention provides a highly efficient heat transfer apparatus suitable for slim and compact electronic devices. Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

According to a non-limiting, illustrative aspect of the present invention, there is provided a heat transfer apparatus with a main body comprising a coolant reservoir that stores liquid coolant supplied from a condensing part, and a vaporization part in which the liquid coolant supplied from the coolant reservoir is vaporized. Also included is a channel region connecting the coolant reservoir to the vaporization zone, which acts as a channel for supplying the liquid coolant from the coolant reservoir to the vaporization zone. The main body is connected to an end of the condensing part through the liquid coolant reservoir. An extension part of the main body is connected to the other end of the condensing part.

It is contemplated that the extension is bent in parallel with the main body from the vaporization part toward the coolant reservoir. It is also contemplated that the extension extends straight out in an opposite direction to the coolant reservoir. The vaporization part is extended into the extension part.

It is also contemplated that the main body comprises an upper plate which contacts a heat generating element, a lower plate combined with the upper plate and sealed, and a wick plate interposed between the upper plate and the lower plate to move the liquid coolant from the coolant reservoir to the vaporization part by capillary action. The extension part is formed by combining and sealing corresponding extended portions of the upper and lower plates of the vaporization part.

In an exemplary embodiment, the coolant reservoir is a space inside a portion of the upper plate that projects outward, and the vaporization part may be a hollowed out portion of the lower plate adjacent to the vaporization part. An inner area of the lower plate of the extended portion may have grooves of a predetermined depth that are connected to the vaporization part along the extended portion.

It is further contemplated that the extended portion of the upper plate corresponding to the grooved region of the extended portion of the lower plate may project outward to form a cavity, and a hole may be formed therein connecting to the other end of condensing part. Alternatively, only the end part of the extended portion of the upper plate may project outward to form a cavity, and a hole connecting to the other end of condensing part is formed therein.

In a further non-limiting embodiment, the lower plate may comprise a wick plate seat region for seating the wick plate where an upper surface of the wick plate seat region is lower than an uppermost surface of the lower plate by the thickness of the wick plate. The wick plate comprises a first zone corresponding to the coolant reservoir, a second zone corresponding to the channel region, and a third zone corresponding to the vaporization part. The first zone and the third zone are formed of a plurality of planar wicks and a plurality of through holes, and protrusions are formed on the tops of the planar wicks facing the upper plate. Protrusions may also be formed in the second zone contacting the upper plate. The upper plate is bonded to the lower plate and to the outer perimeter of the wick plate.

It is even further contemplated that the heat transfer apparatus of the present invention comprises a plurality of support members formed in the vaporization part for supporting the wick plate. The support members are formed on the bottom of the hollowed out portion of the lower plate by a predetermined depth and project toward the upper plate.

The invention also provides for a heat transfer apparatus with a main body comprising means for storing liquid coolant supplied from a condensing part, means for vaporizing liquid coolant supplied from the means for storing liquid coolant and means for channeling liquid coolant from the means for storing liquid to the means of vaporizing liquid coolant. An extension extended from the main body of the heat transfer apparatus connected to the condensing part is also provided.

The heat transfer apparatus according to the present invention is highly efficient and slim, and therefore highly applicable to slim, compact, high-performance electronic products.

DETAILED DESCRIPTION OF ILLUSTRATIVE, NON-LIMITING EMBODIMENTS OF THE INVENTION

Figure 1:
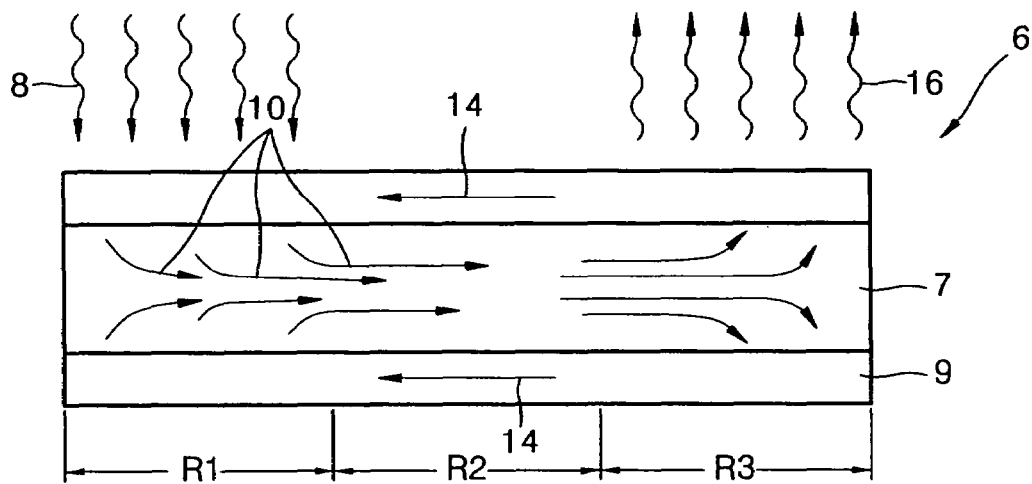
FIG. 1 is a cross-sectional view of a conventional straight heat pipe.
Figure 2:
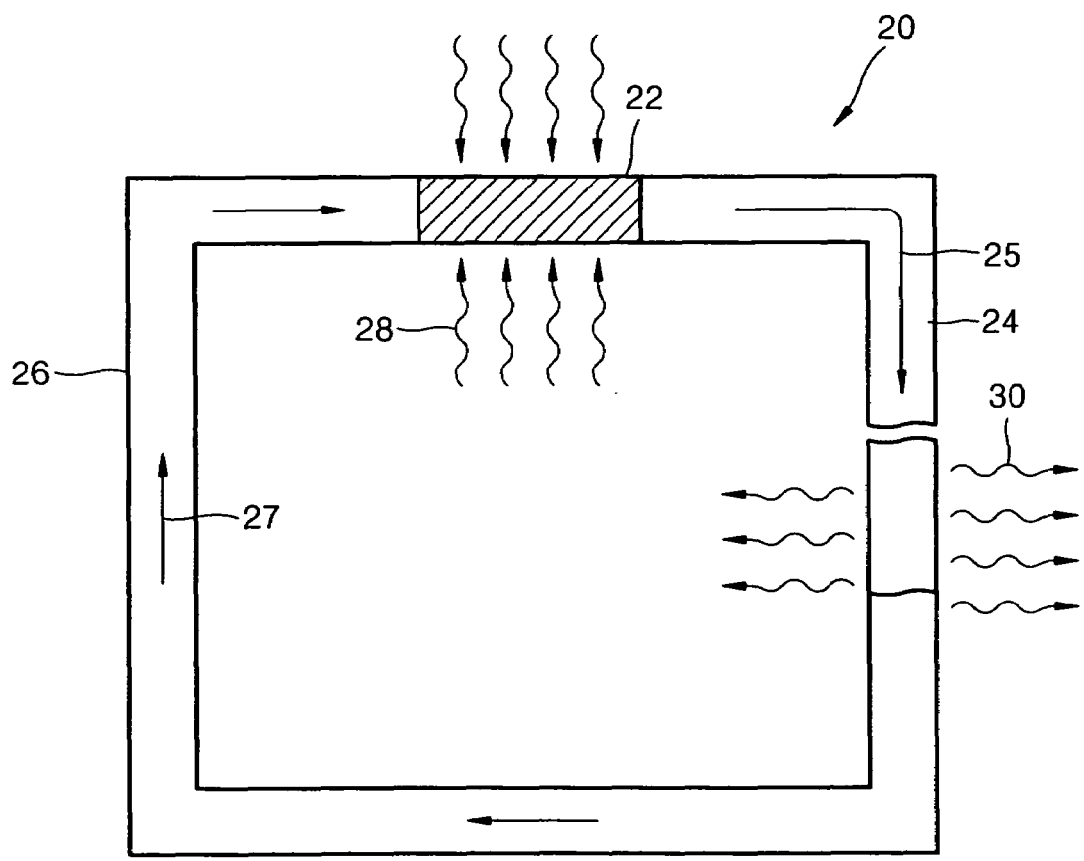
FIG. 2 is a plane view of a conventional loop-type heat pipe.

Hereinafter, exemplary embodiments of a heat transfer apparatus according to the present invention will be described fully with reference to the accompanying drawings. In the drawings, for the purpose of clarity, the thickness of some layers or regions is sometimes exaggerated, and coupling between an upper plate and a lower plate of the heat transfer apparatus is not shown.

Figure 3:
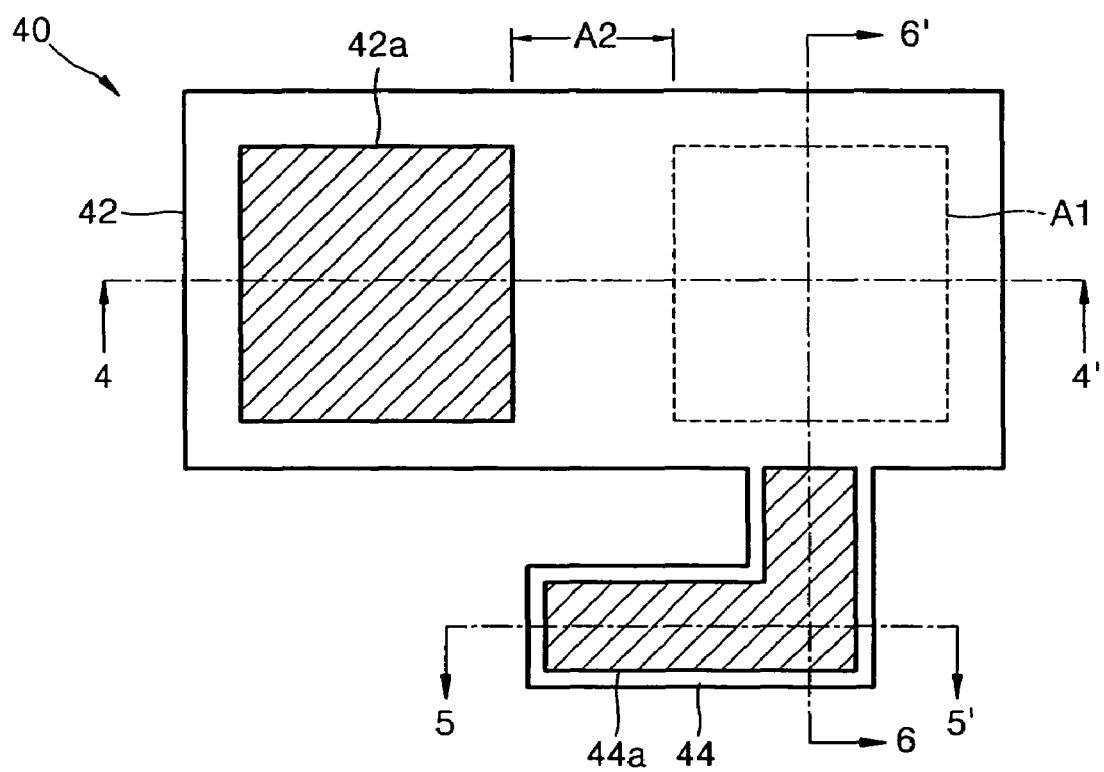
FIG. 3 is a plan view of an upper plate of a heat transfer apparatus according to an embodiment of the present invention.

Referring to FIG. 3, an upper plate 40 of a heat transfer apparatus according to a non-limiting, illustrative embodiment of the present invention comprises an upper main body 42 and an upper extension 44, which is an extended portion of the upper main body. At one end of the upper main body 42, there is a coolant reservoir or means for storing liquid coolant 42a where liquid coolant supplied from a condensing part 43 (shown in FIG. 17) is stored. At the other end of the upper main body 42, a predetermined distance away from the coolant reservoir 42a, there is a heat generating element contact zone A1 to which a heat generating electronic element such as a computer's CPU or the like contacts. In FIGS. 3, 17, 20 and 22, the contact zone A1 of the upper main body 42 is indicated with dotted lines.

A channel region or means for channeling liquid coolant A2, interposed between the coolant reservoir 42a and the contact zone A1, acts as a channel for supplying liquid coolant from the coolant reservoir 42a to the contact zone A1. The upper extension 44 has a predetermined width, extends a predetermined distance outward from a side of the contact zone A1 of the upper main body 42, bends, for example, at 90 degrees, and extends a predetermined distance toward the coolant reservoir 42a of the upper main body 42, parallel to the upper main body 42. The upper extension 44 includes a first vapor collecting part 44a for collecting vapor generated at a vaporization part or means for vaporizing liquid coolant (A3 in FIG. 7) of a lower plate before transferring the vapor to a condensing part. The first vapor collecting part 44a is formed along the upper extension 44 and is narrower than the total width of the upper extension 44.

Figure 4:
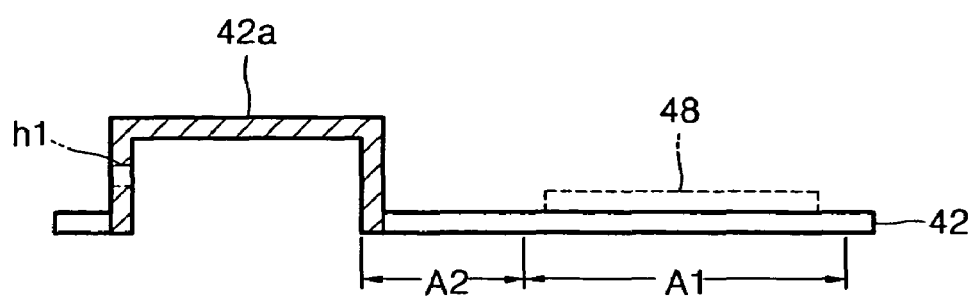
FIG. 4 is a cross-section of the upper plate of FIG. 3 taken along line 4–4'.

FIG. 4 is a cross-section of the upper main body 42 of FIG. 3 taken along line 4–4' which cuts through the center of the liquid coolant reservoir 42a and the contact zone A1. Referring to FIG. 4, the coolant reservoir 42a of the upper main body 42 protrudes upward from the upper main body 42 with a predetermined height. In an embodiment, the coolant reservoir 42a is large enough to both store liquid coolant supplied from the condensing part and collect vapor coexisting with the liquid coolant. A first hole h1 is formed in a side wall of the coolant reservoir 42a near the condensing part, that is, at the opposite side of the coolant reservoir 42a from the channel region. Through the first hole h1, liquid coolant is supplied from the condensing part to the coolant reservoir 42a. For this purpose, a liquid pipe 45 (shown in FIG. 17) though which the liquid coolant is supplied is installed between the condensing part and the coolant reservoir 42a. One end of the pipe is connected to a liquid coolant discharge port of the condensing part, and the other end is connected to the first hole h1 of the coolant reservoir 42a. Reference numeral 48 indicates an imaginary heat generating element in contact with the contact zone A1 of the upper main body 42.

Figure 5:
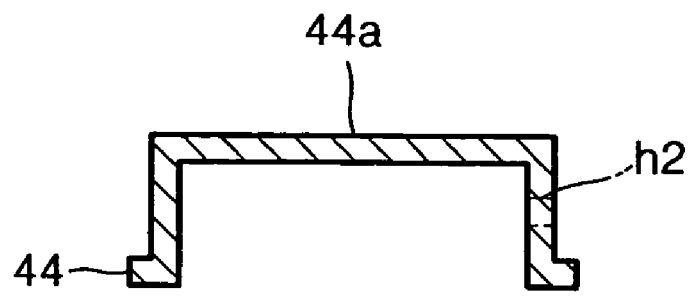
FIGS. 5 and 6 are cross-sections of the upper plate of FIG. 3 taken along lines 5–5' and 6–6', respectively.

Referring to FIG. 5, a cross-section of the upper extension 44 of FIG. 3 taken along line 5–5', it can be seen that the first vapor collecting part 44a of the upper extension 44 projects upward and is empty inside, like the coolant reservoir 42a of the upper main body 42. Vapor created at the vaporization part (A3 in FIG. 7) of the lower plate flows into the first vapor collecting part 44a. A second hole h2 is formed in a side wall of the first vapor collecting part 44a near the end of the upper extension 44, and vapor which flowed into the first vapor collecting part 44a flows into the condensing part through the second hole h2. For this flow, a vapor pipe (not shown) through which vapor is moved is installed between the condensing part and the first vapor collecting part 44a. One end of the vapor pipe is connected to a vapor inlet port of the condensing part and the other end is connected to the second hole h2 of the vapor collecting part 44a.

Figure 6:
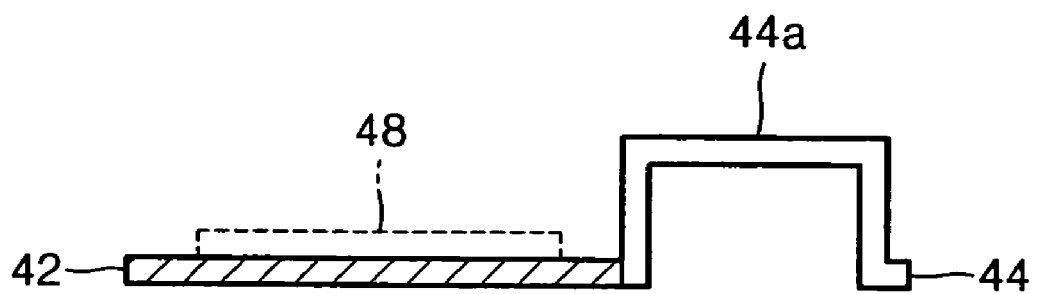

Referring to FIG. 6, a cross-section of the upper plate of FIG. 3 taken along line 6–6', it can be seen that the upper extension 44 projects upward starting from where it branches off from the upper main body 42.

Figure 7:
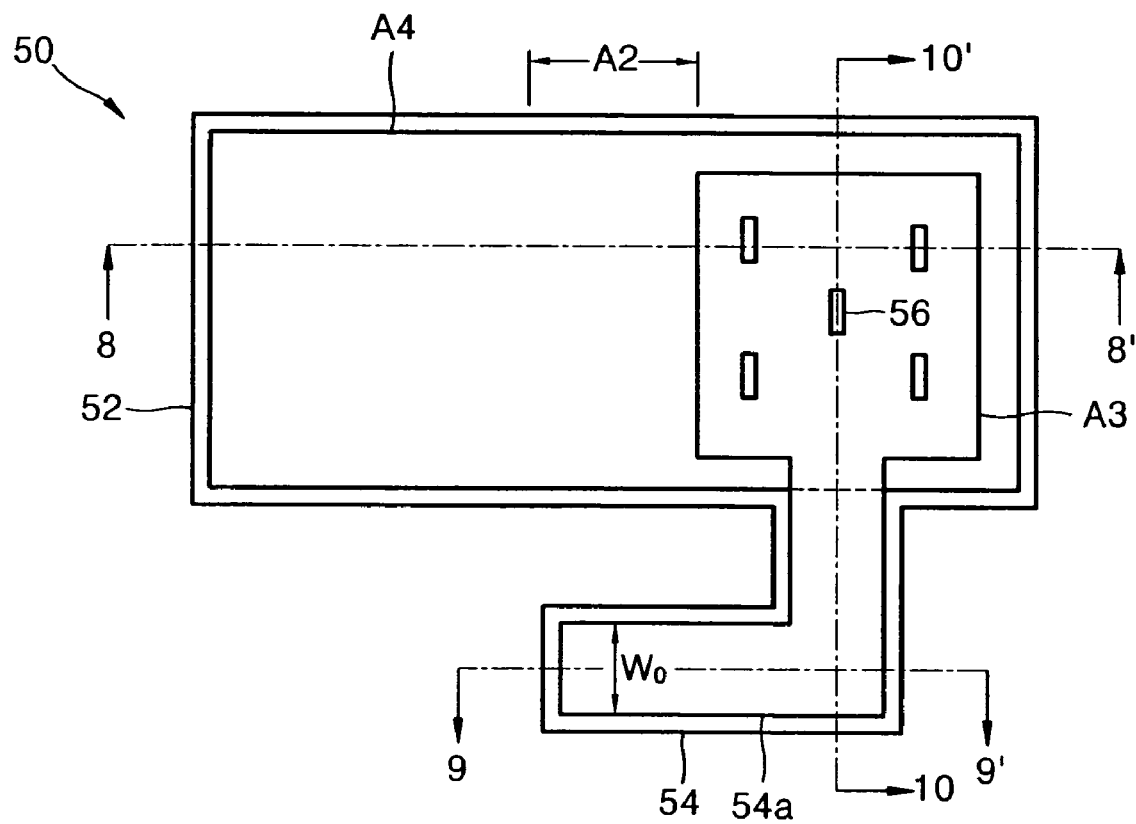
FIG. 7 is a plan view of a lower plate of the heat transfer apparatus according to an embodiment of the present invention.

FIG. 7 is a plan view of a lower plate 50 that contacts the lower surface of the upper plate 40 of the heat transfer apparatus according to a non-limiting, illustrative embodiment of the present invention. Referring to FIG. 7, the lower plate 50 consists of a lower main body 52, which is opposite to the upper main body 42 of the upper plate 40, and a lower extension 54 of the lower main body 52, which opposite to the upper extension 44 of the upper main body 42. A seat region A4 for a wick plate is formed on the lower main body 52. The seat region A4 occupies almost the entire area of the lower main body 52. The rim of the lower main body 52 surrounding the seat region A4 is connected to the upper main body 42 and sealed by welding or other means. A vaporization part A3 which is opposite to the contact zone A1 of the upper main body 42 is formed in the seat region A4 of the lower main body 52. The vaporization part A3 is provided to collect vapor created at the lower surface of the contact zone A1 of the upper main body 42 and transfer the vapor to the condensing part. The vaporization part A3 has the same configuration as the lower extension 54 and extends along with the lower extension 54. The outside of the vaporization part A3 in the lower extension 54 is bonded with the outside area of the first vapor collecting part 44a in the first extension 44 and sealed by welding or other means. Within the vaporization part A3 of the lower main body 52, a plurality of support members 56 are disposed occupying a relatively small area compared to the overall area of the vaporization part A3. The upper ends of the support members 56 are structured to contact the wick plate. In an exemplary embodiment, the support members 56 are mounted such that the wick plate is positioned not far from the lower surface of the upper main body 52 of the upper plate 50 to be within effective range of capillary action of the liquid coolant.

The wick plate plays the role of supplying liquid coolant of the coolant reservoir 42a of the upper main body 42 of the upper plate 50 to a lower surface opposite to the contact zone A1 of the upper main body 42. This will be described later on.

Figure 8:
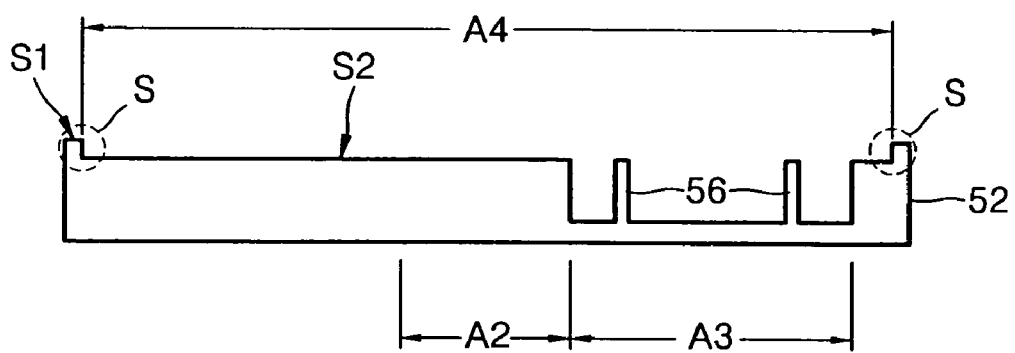
FIG. 8 is a cross-section of the lower plate of FIG. 7 taken along line 8–8'.

Referring to FIG. 8, a cross-section of the lower plate 50 of FIG. 7 taken along line 8–8', the surface S2 of the wick plate seat region A4 is lower than the surface S1 of the lower main body 52. Therefore, there is a step S between the surface S1 of the lower main body 52 and the wick plate seat region A4. Preferably, but not necessarily, the step S is the same height as the thickness of the wick plate so that the top surface of the wick plate is level with surface S1 when fixed horizontally in the wick plate seat region A4 of the lower main body 52.

Also, referring to FIG. 8, the vaporization part A3 is formed in the wick plate seat region A4 with a predetermined depth. However, considering the role of the vaporization part A3, the vaporization part A3 may be much deeper than the height difference S. The support members 56 formed on the bottom of the vaporization part A3 are projected upward. The projected height of the support members 56 is the same as the depth of the vaporization part A3. Thus, the upper surfaces of the support members 56 are at the same level as the surface of the wick plate seat region A4.

Referring to FIGS. 7 and 8 together, the support members 56 are shown to be square columns, but they can also be circular, oval, or triangular columns. Also, the support members 56 have several shapes of array such as circle, triangle.

Figure 9:
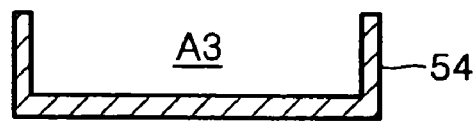
FIGS. 9 and 10 are cross-sections of the lower plate of FIG. 7 taken along lines 9–9' and 10–10', respectively.

FIG. 9 is a cross-section of the lower plate 50 of FIG. 7 taken along line 9–9', that is, taken along the center line of the lower extension 54 parallel to the lower main body 52. Referring to FIGS. 7 and 9 together, an inner region 54a of the lower extension 54 is grooved with a predetermined depth. Considering that the lower extension 54 is an extension of the lower main body 52, and the inner region 54a of the lower extension 54 is an extension of the vaporization part A3 to the lower extension 54, the depth of the inner region 54a of the lower extension 54, in an exemplary embodiment, is the same as the depth of the vaporization part A3 of the lower main body 52.

As described above, the lower extension 54 is preferably arranged parallel to the lower main body 52, but this is not a necessity. Also, the width W0 of the inner region 54a of the lower extension 54 is preferably constant throughout the whole region of the lower extension 54 as depicted in FIG. 7, but this is not a necessity either. For example, the width W0 of the inner region 54a of the lower extension 54 can gradually increase from the start of the lower extension 54 to its end.

Figure 10:
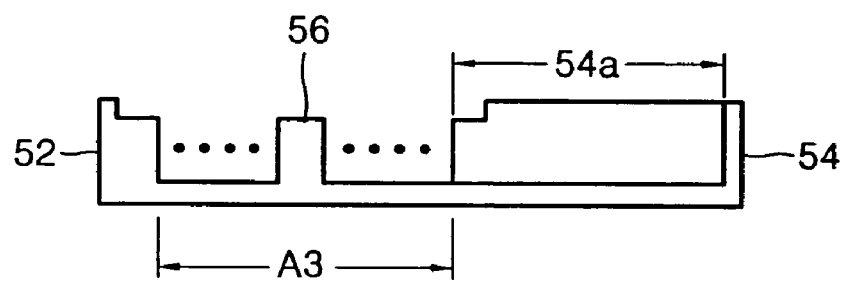

Referring to FIG. 10, a cross-section of the lower plate of FIG. 7 taken along the line 10–10', it is observed that the vaporization part A3 of the lower main body 52 has the same depth as the inner region 54a of the lower extension 54, and the support members 56 projecting from the bottom of the vaporization part A3 have the same height as the depth of the inner region 54a of the lower extension 54.

Figure 11:
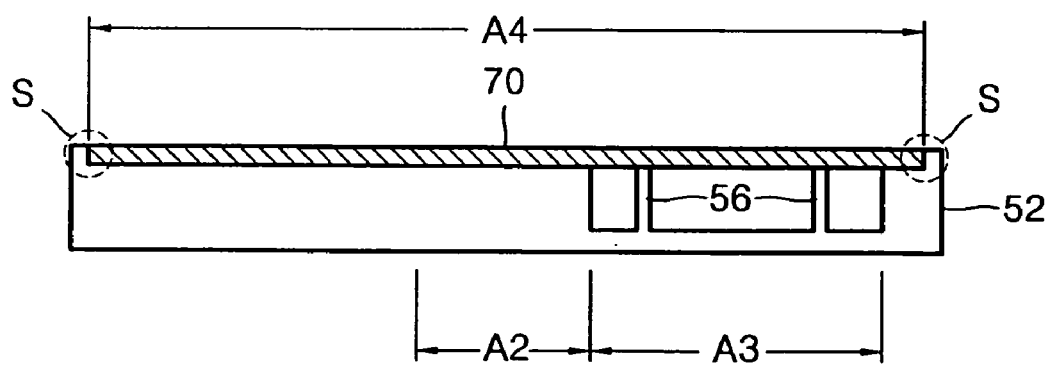
FIG. 11 is a cross-section of the lower plate of FIG. 7 with a wick plate mounted thereon, taken along line 8–8'.

Referring to FIG. 11 a wick plate 70 is mounted on the wick plate seat region A4 of the lower main body 52. As described above, the step S between the surface S2 of the wick plate seat region A4 and the surface S1 of the lower main body 52 is the same as the thickness of the wick plate 70. The vaporization part A3 is covered by the wick plate 70 when the wick plate 70 is mounted on the wick plate seat region A4.

Figure 12:
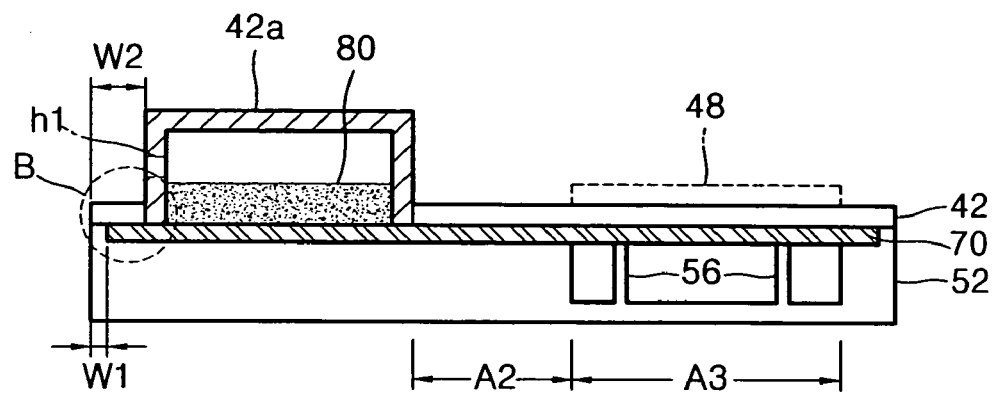
FIG. 12 is a cross-section of the combined structure of the upper plate of FIG. 3, the lower plate of FIG. 7, and the plate wick of FIG. 1, taken along line 8–8' in FIG. 7.

FIG. 12 is a cross-section of the combined structure of the upper plate 40, lower plate 50, and wick plate 70 seated in the wick plate seat region A4, taken along line 8–8' in FIG. 7. Referring to FIG. 12, the upper and lower main bodies 42 and 52 are bonded and tightly sealed along all edges. Reference symbol B indicates a portion where the upper main body 42 is bonded with the lower main body 52. As can be seen, the upper main body 42 has a wider bonding area (width W2) than the lower main body 52 (width W1), for achieving a tight seal. Here, the excess bonding area of the rim of the upper main body 42 that is not bonded with the rim of the lower main body 52 is bonded with the upper surface of the wick plate 70 around its outer perimeter. Consequently, the wick plate 70 is fixed in place in the course of bonding the upper main body 42 of the upper plate 40 with the lower main body 52 of the lower plate 50, by welding or some other means of tight sealing. Since the wick plate 70 is fixed in place in this manner, a marginal width of its upper surface extending around its perimeter for bonding with the upper main body 42, in an exemplary embodiment, is not patterned with a wick pattern by which a capillary action is generated when the wick plate 70 is formed by metal etching.

Continuing to refer to FIG. 12, liquid coolant 80 is supplied from the condensing part through the first hole h1. A space between the surface of the liquid coolant 80 and the ceiling of the coolant reservoir 42a is for collecting vapor coexisting with the liquid coolant 80 or flowing in from the condensing part together with the liquid coolant 80. The liquid coolant 80 collected in the coolant reservoir 42a undergoes capillary action due to the wick pattern formed in wick plate 70 and travels to a region of the wick plate 70 corresponding to the vaporization part A3 via the channel zone A2. The liquid coolant 80 then vaporizes in the vaporization part A3 by absorbing heat from the heat generating element 48. Through this process, the heat generating element 48 is cooled, and the heat absorbed by the coolant turning it into vapor is transferred to the condensing part by the vapor and released to the outside. Upon releasing the heat, the vapor condenses into liquid coolant again.

Figure 13:
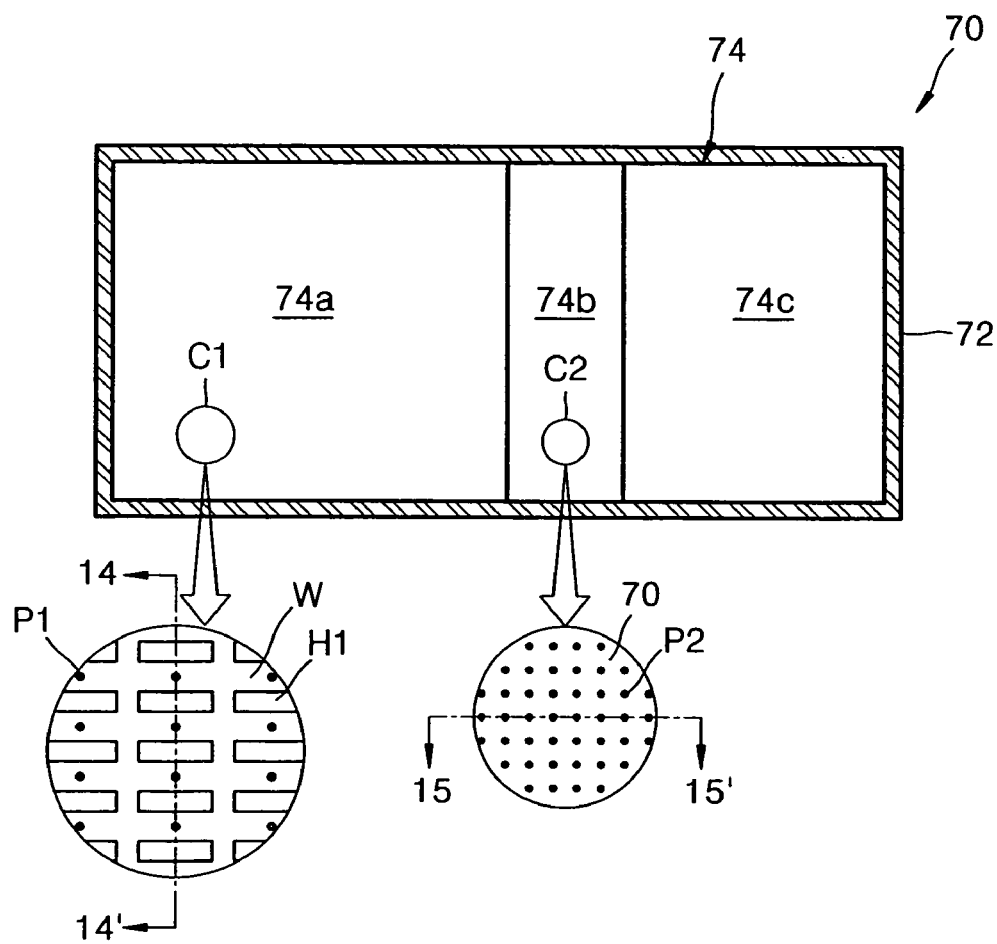
FIG. 13 shows the structure of a region of a wick plate inserted between the upper and lower plates of the heat transfer apparatus according to an embodiment of the present invention.

FIG. 13 is a plan view of an example of the structure of the wick plate 70 depicted in FIG. 12. Here, reference numeral 72 indicates the edge of the wick plate 70 that is bonded with the edge of the lower main body 52 of the lower plate 50 and the edge of the upper main body 42 of the upper plate 40, and reference numeral 74 indicates the inner wick pattern region of the wick plate 70 where the wick pattern is formed.

The wick pattern region 74 comprises a first zone 74a, a second zone 74b, and a third zone 74c. The first zone 74a is located under the coolant reservoir 42a of the upper plate 40, and the second zone 74b is actually a channel region acting as a passage for the liquid coolant 80 to flow from the coolant reservoir 42a to the vaporization part A3. The upper face of the second zone 74b contacts the channel region A2 of the upper main body 42, and the lower face contacts a predetermined region of the lower main body 52, in the channel region A2. The third zone 74c is positioned between the surface of the upper main body 42 opposite to the contact zone A1 and the vaporization part A3 of the lower main body 52. That is, the upper face of the third zone 74c contacts the lower surface of the upper main body 42 in the contact zone A1, and the lower surface of the third zone 74c contacts the support members 56 formed in the vaporization part A3.

The wick patterns formed in the first zone 74a, the second zone 74b, and the third zone 74c can be varied to have many different forms. For example, referring to a magnified drawing of a predetermined area C1 in the first zone 74a, the wick pattern of the first zone 74a consists of a plurality of first planar wicks W and first through holes H1 formed between the first planar wicks W. A plurality of first protrusions P1 is formed on the surface of the plurality of first planar wicks W. It is preferable, but not necessary, that the plurality of first planar wicks W have the same length as the first through holes H1 and are arranged in rows. They may have a different length and may be arranged in other patterns such as a zigzag pattern.

Referring to a magnified drawing of a predetermined area C2 in second zone 74b, there are no through holes. Instead, the entire second zone 74b is a thin film connected to the first planar wick W of the first zone 74a and the wick patterns consisting of the third zone 74c, and a plurality of second protrusions P2 are formed thereon. The second protrusions P2 are a means to keep a minimum gap between the second zone 74b of the wick plate 70 and the upper main body 42 of the upper plate 40 so that the liquid coolant flows through the gap by capillary action. Therefore, in an exemplary embodiment, the height of the second protrusions P2 is lower than the thickness of the wick plate 70. The heights of the first protrusions P1 and the second P2 protrusions may be differentor the same. A tiny gap thus formed between the second zone 74b of the wick plate 70 and the upper main body 42 of the upper plate 40 becomes a channel region for coolant flow by capillary action. Through the tiny gap, the liquid coolant 80 of the coolant reservoir 42a travels to the vaporization part A3.

In the present embodiment, the wick pattern of the third zone 74c of the wick pattern region 74 is the same as the wick pattern of the first zone 74a. However, in alternative embodiments, the wick patterns of the third zone 74c and the first zone 74a may be different, and the wick patterns of the second zone 74b and the first zone 74a may be the same or not. Wick patterns will be described in more detail later on.

Figure 14:
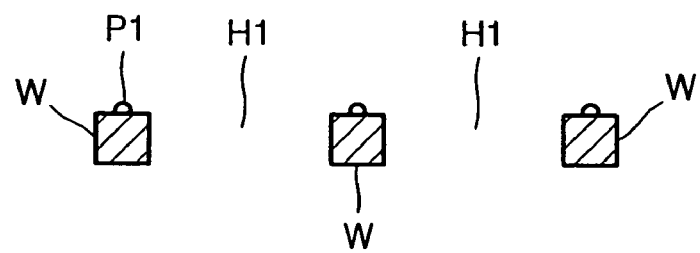
FIGS. 14 and 15 are cross-sections of the structure shown in FIG. 13 taken along lines 14–14' and 15–15', respectively.

FIG. 14 is a cross-section of the magnified drawing of the area C1 of the first zone 74a in FIG. 13 taken along line 14–14'. Referring to FIG. 14, the first planar wicks W, the first through holes H1 formed between the first planar wicks W, and the first protrusions P1 formed on the first planar wicks W can be seen. Also, it is observed that the height of the first protrusions P1 is smaller than the thickness of the first planar wicks W.

Figure 15:
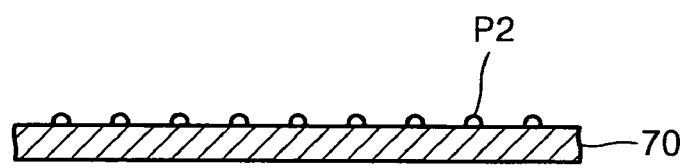

FIG. 15 is a cross-section of the magnified drawing of the area C2 of the second zone 74b in FIG. 13 taken along line 15–15'. Referring to FIG. 15, the second protrusions P2 formed on the wick plate 70 can be seen.

Figure 16:
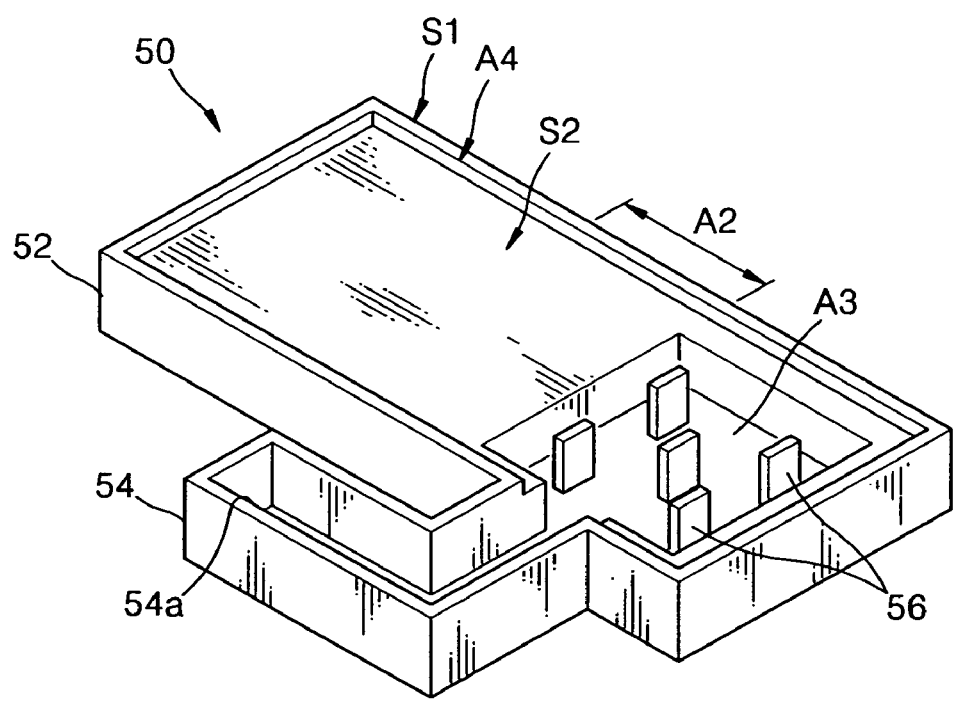
FIG. 16 is a perspective view of the top of a lower plate of the heat transfer apparatus formed according to an embodiment of the present invention.

FIG. 16 is a perspective view of the lower plate 50 of FIG. 7. Referring to FIG. 16, the step S (refer to FIG. 8) between the surface S1 of the lower main body 52 and the surface S2 of the wick plate seat region A4 can be clearly seen. It is also clearly seen that the vaporization part A3 of the lower main body 52 and inner region 54a of the lower extension 54 are connected to form one body.

Figure 17:
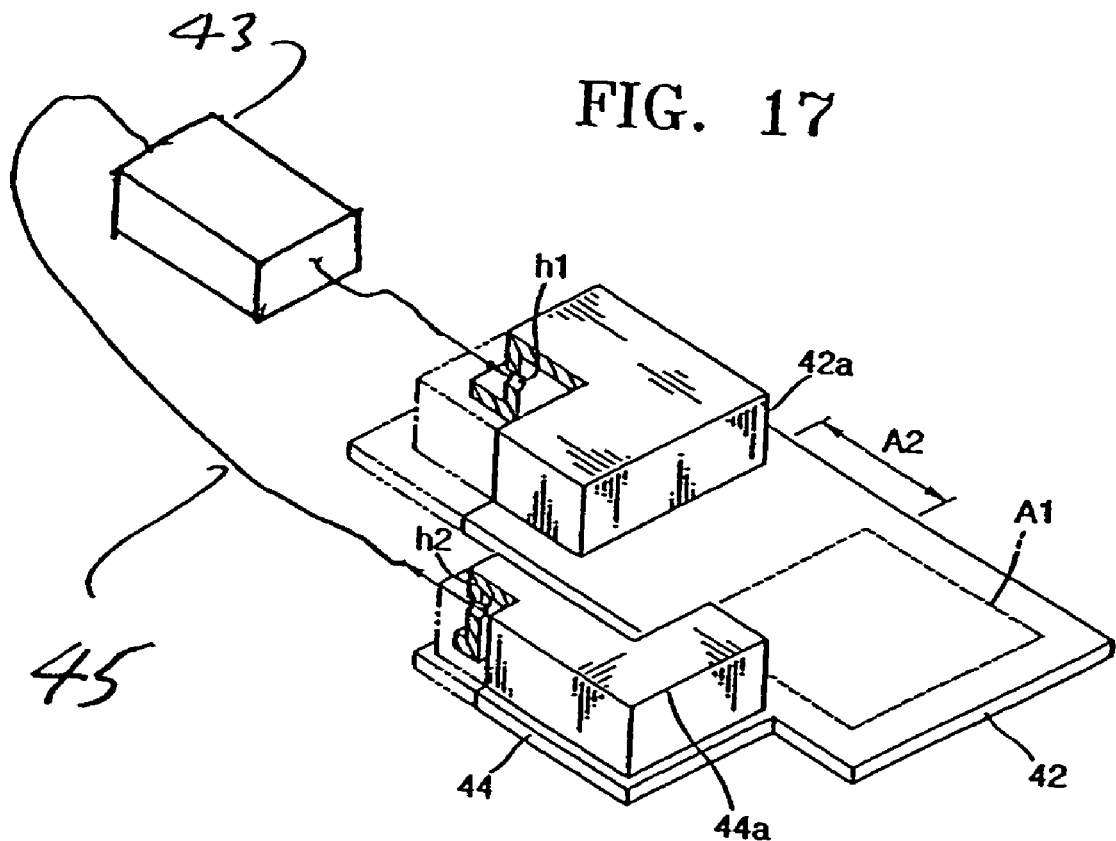
FIG. 17 is a perspective view of the top of an upper plate of the heat transfer apparatus according to an embodiment of the present invention.

FIG. 17 is a perspective view of the upper plate 40 of FIG. 3. Referring to FIG. 17, structures of the coolant reservoir 42a projecting upward from the upper main body 42, and the first vapor collecting part 44a also formed projecting upward from the upper extension 44, are clearly visible.

Figure 18:
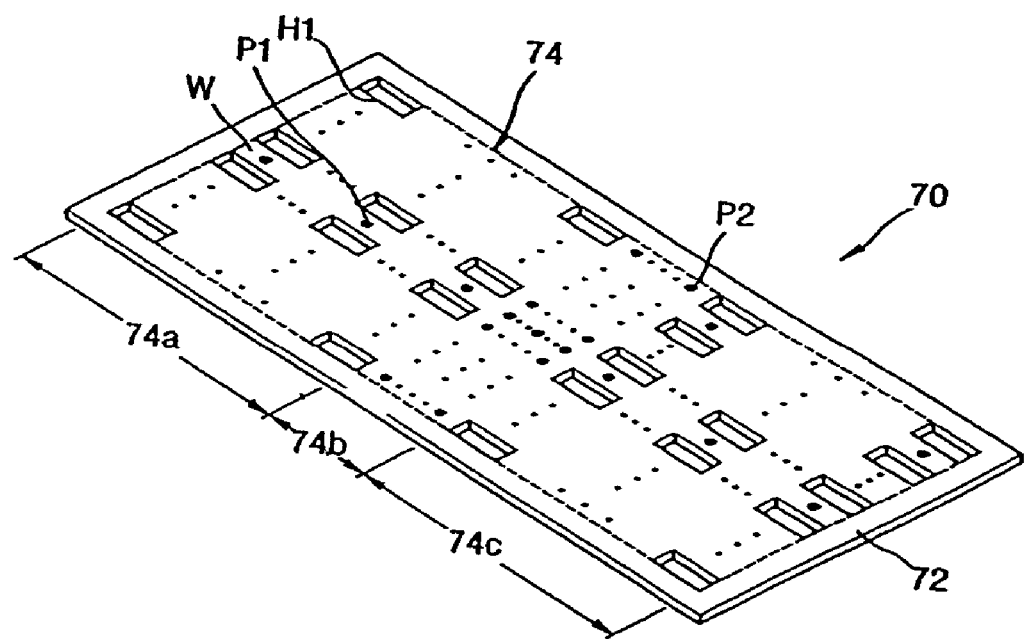
FIG. 18 is a perspective view of the wick plate depicted in FIG. 13.

FIG. 18 is a perspective view of the wick plate 70 of FIG. 13. It can be seen that the plurality first through holes H1 are formed in the first and third zones 74a and 74c, the planar wicks W are placed between the first through holes H1, the first protrusions P1 are formed on the first planar wicks W, and only the second protrusions P2 are formed on the second zone 74b.

Figure 19:
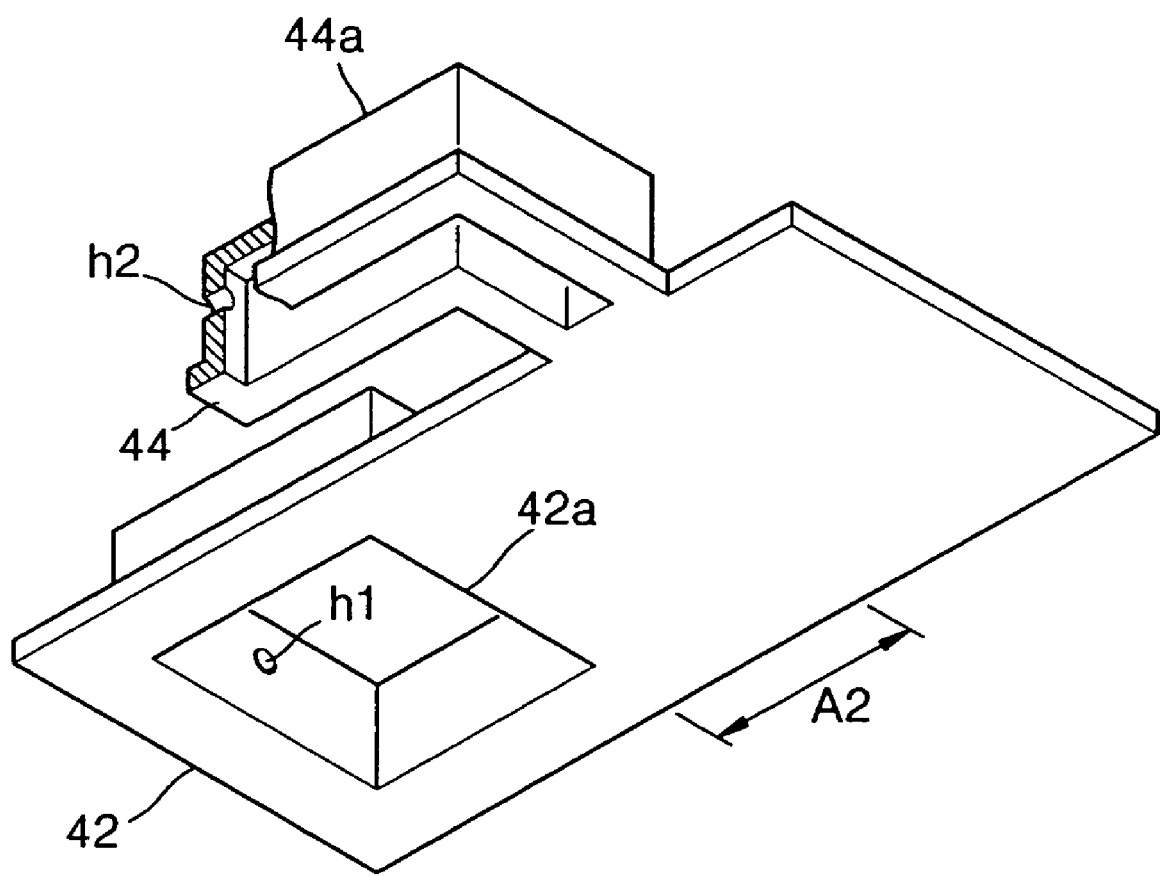
FIG. 19 is a perspective view of the bottom of an upper plate of the heat transfer apparatus according to an embodiment the present invention.

FIG. 19 is a perspective view of the underside of the upper plate 40 of FIG. 3. It can be seen that the inside of the coolant reservoir 42a and the first vapor collecting part 44a of the upper extension 44 is just empty space. Liquid coolant is supplied to the empty space of the coolant reservoir 42a from the condensing part through the first hole h1. Also, vapor created in the vaporization part A3 is collected in the empty space inside the first vapor collecting part 44a of the upper extension 44 and then traveled to the condensing part through the second hole h2 formed in the first vapor collecting zone 44a.

Figure 20:
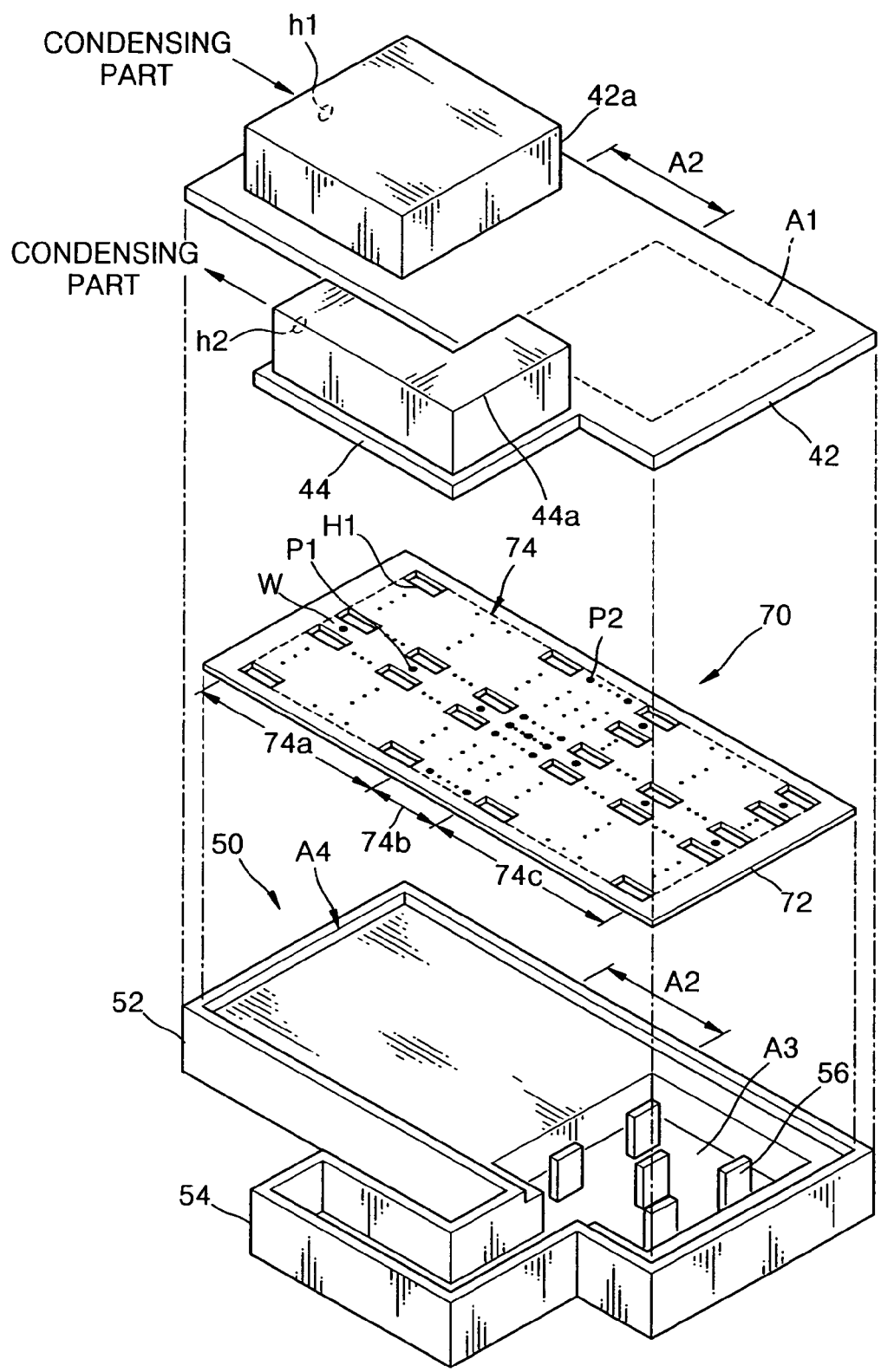
FIG. 20 is an exploded perspective view of the heat transfer apparatus according to an embodiment of the present invention.

FIG. 20 is an exploded perspective view of a heat transfer apparatus according to the present invention. FIG. 20 clearly shows the mounting relationship between the lower plate 50, the wick plate 70 and the upper plate 40. That is, the wick plate 70 is mounted on the wick plate seat region A4 of the lower plate 50, and the lower plate 50 is combined with the upper plate 40 to complete the heat transfer apparatus. As described above, during assembly, the edge of the upper plate 40 is bonded to the edge 72 of the wick plate 70 and the edge of the lower plate 50, and tightly sealed by welding or the like.

Figure 21:
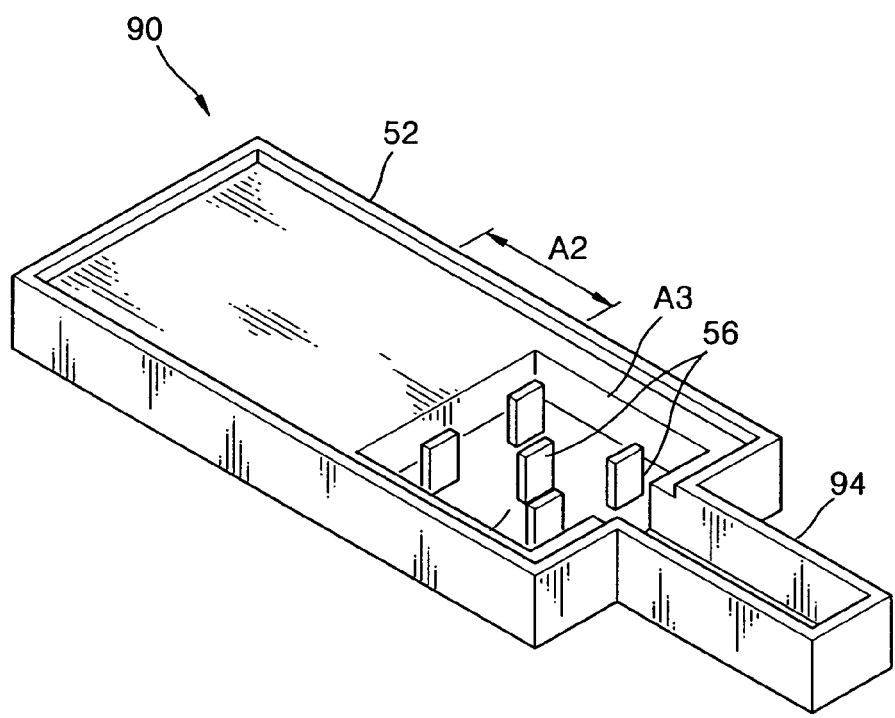
FIG. 21 is a perspective view of a modified example of the lower plate of the heat transfer apparatus according to an embodiment of the present invention.
Figure 22:
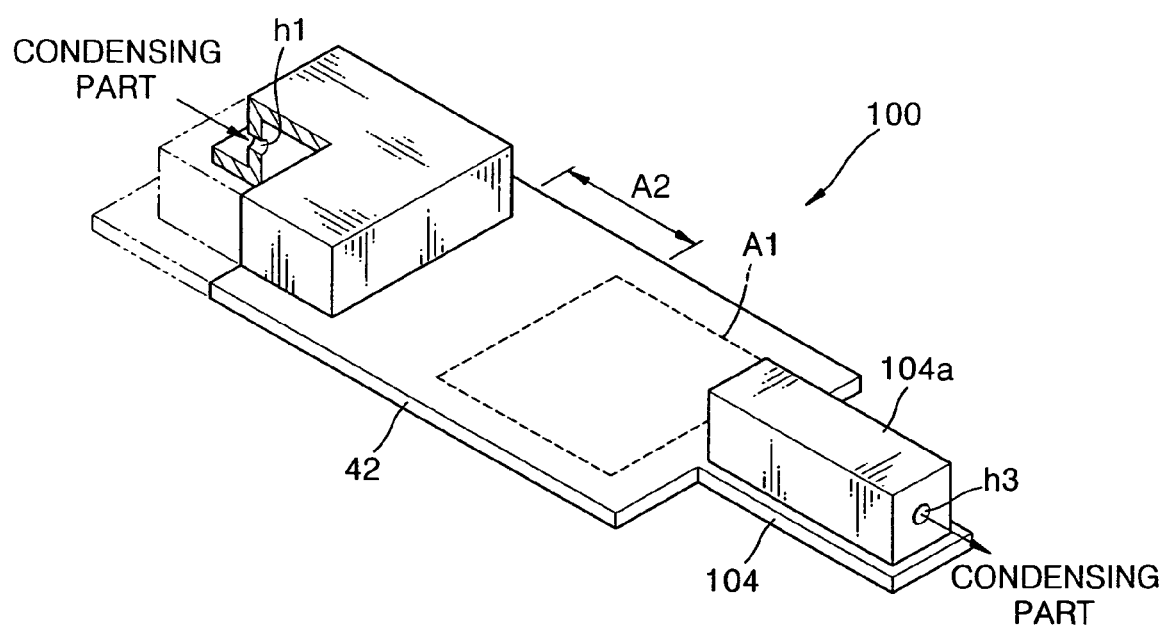
FIG. 22 is a perspective view of an example of a modified upper plate, which is coupled with the modified lower plate depicted in FIG. 21, of the heat transfer apparatus according to an embodiment of the present invention.
Figure 23:
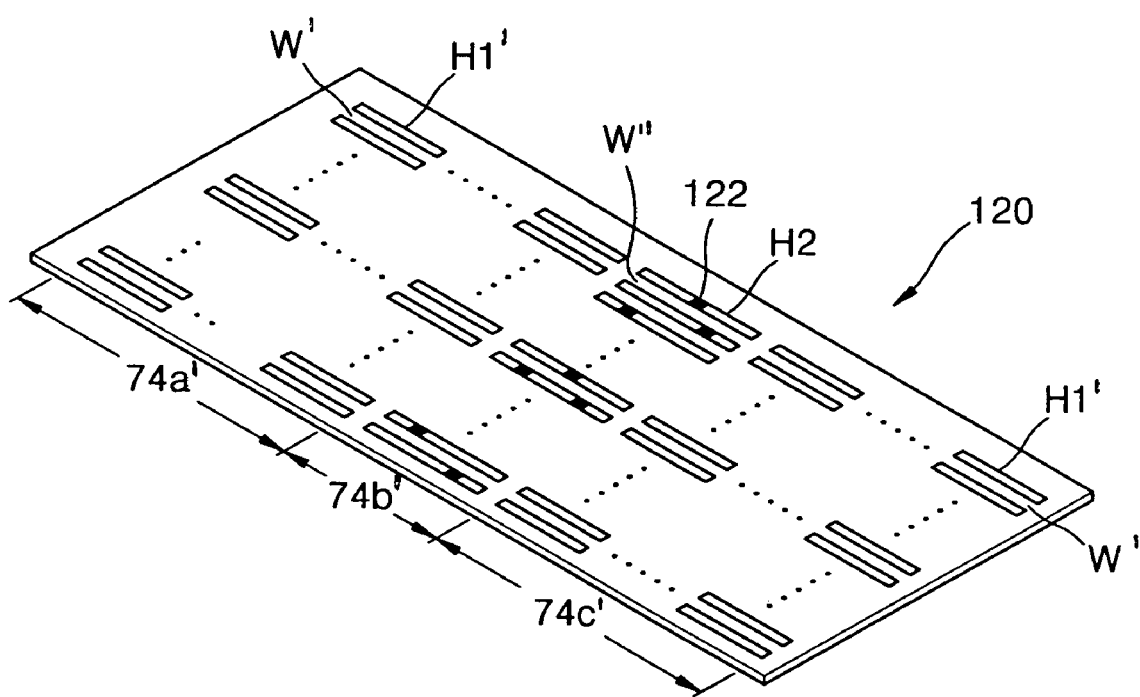
FIG. 23 is a perspective view of an example of a modified wick plate inserted between the upper and lower plates of the heat transfer apparatus according to an embodiment of the present invention.

In the heat transfer apparatus of the present invention, as described above, the lower plate 50, the upper plate 40, and the wick plate 70 may be modified in different form. FIGS. 21 through 23 show some examples of the many possible modifications.

Specifically, FIG. 21 is a perspective view of a modified lower plate. Referring to FIG. 21, a modified lower plate 90 comprises a lower main body 52 and an extension 94 that a part of the lower main body 52 is extended. The extension 94 extends straight out from a part of the right side of the lower main body 52 parallel to the lower main body 52. The vaporization part A3 is extended along the extension 94. Hence, the inner region of the third extension 94 is grooved with the same depth as in the vaporization part A3 in the lower main body 52.

FIG. 22 is a perspective view of a modified upper plate 100 that could be combined with the modified lower plate 90 of FIG. 21. Referring to FIG. 22, the modified upper plate 100 comprises an upper main body 42 and extension 104 which a part of the upper main body 42 is extended. The extension 104 is a straight form parallel to the upper main body 42 and corresponds in shape and position to the extension 94 shown in FIG. 21. A second vapor collecting part 104a that performs the same role as the first vapor collecting part 44a is formed in the extension 104. At the end wall of the second vapor collecting part 104a, a third hole H3 is formed. The third hole H3 is connected to a vapor conduit which is connected to the condensing part.

FIG. 23 is a perspective view of a modified wick plate 120. Referring to FIG. 23, the wick pattern region of the modified wick plate 120 comprises a first zone 74a', a second zone 74b', and a third zone 74c' like the wick plate 70 of FIG. 18. However, in the modified wick plate 120, the wick pattern formed in the first and third zones 74a' and 74c' is made up of only first through holes H1' and first planar wicks W', but no protrusions are formed on the first planar wicks W'. Also, in the modified wick plate 120, the wick pattern formed in the second zone 74b' does not have the second protrusions P2 found in the second zone 74b of the wick plate 70. Instead, the second zone 74b' of the modified wick plate 120 is made up of second through holes H2 and second planar wicks W''', which are both longer than the first through holes H1' and the first planar wicks W' formed in the first and third zones 74a' and 74c'. Since the liquid coolant travels between the second planar wicks W''' and the upper plate 40 or the modified upper plate 100 in the second zone 74b', in an exemplary embodiment, both the second through holes H2 and the second planar wicks W''' maintain a uniform gap.

In actuality, the first and the second planar wicks W' and W''' are too thin to see with the naked eye. Moreover, since the second planar wicks W''' are longer than the first planar wicks W', they would be prone to lean to one side when the liquid coolant is supplied. Such leaning could affect the supply of liquid coolant to the vaporization part A3 and potentially cause partial dry out of the vaporization part A3. In order to avoid such leaning of the second planar wicks W''' in the second zone 74b', tiny bridges 122 are placed between the second planar wicks W'''. Preferably, but not necessarily, at least one tiny bridge 122 is placed between every two neighboring second planar wicks W'''.

Alternatively, third protrusions (not shown) which correspond to the first and second protrusions P1 and P2 could be formed on the first and the second planar wicks W' and W''' of the second wick plate 120. In this case, a tiny gap corresponding to the height of the third protrusions is formed between the modified wick plate 120 and the upper plate 40 or the modified upper plate 100. This gap provides a passage for the liquid coolant to flow smoothly from coolant reservoir 42a to the vaporization part A3.

While the present invention has been particularly shown and described with reference to exemplary embodiments thereof, it should not be construed as being limited to the embodiments set forth herein. Various modifications to the embodiments described can be made by those of skill in the art without departing from the scope of the present invention. For example, instead of a removable wick plate, a modified embodiment of the heat transfer apparatus of the present invention might comprise a wick pattern formed in a predetermined area of the lower plate facing the coolant reservoir, and another wick pattern formed in a predetermined area of the upper plate facing the channel zone and the vaporization part and connected to the wick pattern formed in the lower plate. Also, with regard to the extensions, the vaporization part does not need to be extended to the whole area of the lower extension of the lower plate, but could be extended to a predetermined portion of the lower extension, leaving the rest vacant. Accordingly, the true scope of the present invention is determined not by the above description, but by the appended claims and their equivalents.

As described above, the heat transfer apparatus according to the present invention has a tightly sealed, slim structure comprising a lower plate, an upper plate, and a wick plate interposed therebetween. Thus, the heat transfer apparatus according to the present invention can be readily applied to slim, compact electronic devices. Moreover, vapor created at the vaporization part can be quickly removed from the vaporization part since a portion of the vaporization part is extended a predetermined distance from the main body through the extension. Because the vapor created at the vaporization part has latent heat, its quick removal from the vaporization part means more rapid cooling of the heat generating element. Accordingly, by employing the heat transfer apparatus according to the present invention, higher heat transfer efficiency (cooling efficiency) can be obtained.

What is claimed is:

1. A heat transfer apparatus comprising:
   a main body, the main body comprising,
      a coolant reservoir which stores liquid coolant supplied from a condensing part;
      a vaporization part in which the liquid coolant supplied from the coolant reservoir is vaporized, the vaporization part having a grooved section; and
      a channel region connecting the coolant reservoir to the vaporization part, which supplies the liquid coolant from the coolant reservoir to the vaporization part; and
   an extension extended from the main body and connected to the condensing part, wherein the grooved section of the vaporization part extends into the extension, and a wick plate is provided in the vaporization part to cover the grooved section.

2. The heat transfer apparatus as claimed in claim 1, wherein the extension extends out from the vaporization part toward the coolant reservoir and parallel to the main body.

3. The heat transfer apparatus as claimed in claim 1, wherein the extension extends out from the vaporization part in an opposite direction to the coolant reservoir.

4. The heat transfer apparatus as claimed in claim 1, wherein the vaporization part is extended into the extension.

5. The heat transfer apparatus as claimed in claim 1, wherein the main body comprises:
   an upper plate which contacts a heat generating element;
   a lower plate; and
   the wick plate is interposed between the upper plate and the lower plate to make the liquid coolant from the coolant reservoir move to the vaporization part by capillary action,
   wherein the extension is a combination of corresponding extended portions of the upper and lower plates adjacent to the vaporization part.

6. The heat transfer apparatus as claimed in claim 5, wherein the coolant reservoir is a space inside a portion of the upper plate that projects outward.

7. The heat transfer apparatus as claimed in claim 5, wherein the vaporization part is a hollowed out portion of the lower plate.

8. The heat transfer apparatus as claimed in claim 5, wherein an inner region of the extended portion of the lower plate has a grooved region to connect the extension to the vaporization part.

9. The heat transfer apparatus as claimed in claim 8, wherein the extended portion of the upper plate corresponding to the grooved region of the extended portion of the lower plate projects outward to form a cavity, and a hole is formed therein connecting to the condensing part.

10. The heat transfer apparatus as claimed in claim 8, wherein in the extended portion of the upper plate corresponding to the grooved region of the extended portion of the lower plate, only an end part of the extended portion of the upper plate projects outward to form a cavity, and a hole connecting to the condensing part is formed in the extended portion of the upper plate.

11. The heat transfer apparatus as claimed in claim 5, wherein the lower plate further comprises a wick plate seat region for seating the wick plate, an upper surface of the wick plate seat region being lower than an uppermost surface of the lower plate by the thickness of the wick plate.

12. The heat transfer apparatus as claimed in claim 5, wherein the wick plate comprises:
   a first zone corresponding to the coolant reservoir;
   a second zone corresponding to the channel region; and
   a third zone corresponding to the vaporization part.

13. The heat transfer apparatus as claimed in claim 12, wherein the first zone and the third zone are formed of a plurality of planar wicks and a plurality of through holes, and protrusions are formed on the tops of the planar wicks facing the upper plate.

14. The heat transfer apparatus as claimed in claim 12, wherein protrusions are formed in the second zone contacting the upper plate.

15. The heat transfer apparatus as claimed in claim 5, wherein the upper plate is bonded to the lower plate so that the outer perimeter of the wick plate is fixed by the upper and lower plates.

16. The heat transfer apparatus as claimed in claim 7, further comprising a plurality of support members formed in the vaporization part for supporting the wick plate.

17. The heat transfer apparatus as claimed in claim 16, wherein the support members are disposed on the bottom of the hollowed out portion of the lower plate and project toward the upper plate.

18. The heat transfer apparatus as claimed in claim 13, wherein protrusions are disposed in the second zone contacting the upper plate.

19. The heat transfer apparatus as claimed in claim 2, wherein the extension includes a portion which is bent.

20. The heat transfer apparatus as claimed in claim 5, wherein the lower plate and upper plate are sealed.

21. The heat transfer apparatus as claimed in claim 3, wherein the extension extends straight out from the vaporization part.

22. The heat transfer apparatus as claimed in claim 1, wherein the extension forms a vapor collecting part.

23. A heat transfer apparatus comprising:
   a main body, the main body comprising,
      means for storing liquid coolant supplied from a condensing part;
      means for vaporizing liquid coolant supplied from the means for storing liquid coolant, the means for vaporizing having a grooved portion; and
      means for channeling liquid coolant from the means for storing liquid coolant to the means of vaporizing liquid coolant;
   an extension extended from the main body and connected to the condensing part, the grooved portion extending into the extension; and
   a means for wicking the liquid coolant provided over the grooved portion of the means for vaporizing.

24. The heat transfer apparatus as claimed in claim 23, wherein the extension extends out from the means for vaporizing liquid coolant toward the means for storing liquid coolant and parallel to the main body of the heat transfer apparatus.

25. The heat transfer apparatus as claimed in claim 23, wherein the extension extends out from the means for vaporizing liquid coolant in an opposite direction to the means for storing liquid coolant.

* * * * *